United States Patent [19]

Nagao

[11] 3,816,847

[45] June 11, 1974

[54] LIGHT-SENSIBLE SEMICONDUCTOR DEVICE

[75] Inventor: Hiroyuki Nagao, Tokyo, Japan

[73] Assignee: Nippon Electric Company, Limited, Tokyo, Japan

[22] Filed: May 17, 1973

[21] Appl. No.: 361,326

[30] Foreign Application Priority Data

May 19, 1972 Japan .............................. 47-50101

[52] U.S. Cl. .......................357/17, 357/74, 357/81 313/108 D, 174/52 S

[51] Int. Cl. ........................... H01l 3/00, H01l 5/00

[58] Field of Search ............... 313/108 D; 174/52 S; 317/234, 1, 4, 4.1, 6, 235, 27, 27.1

[56] References Cited

UNITED STATES PATENTS 3,288,585 11/1966 Clarke ............................ 313/108 D

FOREIGN PATENTS OR APPLICATIONS 1,487,314 5/1967 France ............................ 313/108 D

OTHER PUBLICATIONS

Opto Electronics; Solid-State-Light Emitters; by Sandlin pp. 73 to 77, January 1965.

IBM Technical Disclosure Bulletin; Mount for Light Emitting Diode; By Sunners, Vol. 8 No. 7, December 1965 pp. 1015.

IBM Technical Disclosure Bulletin; Touch Sensitive Device By Shah, Vol. 9 No. 10 March 1967 page 1366.

*Primary Examiner*—Andrew J. James

*Attorney, Agent, or Firm*—Sandoe, Hopgood & Calimafde

[57] ABSTRACT

A light-sensible semiconductor device comprises a hermetic sealing case provided with a thin planar glass plate as the top surface member. A light-sensible semiconductor chip is fixed in position within the hermetic sealing case in proximity to the planar glass plate, and a light converging lens is attached onto the planar glass plate. A holder member for the light converging lens is closely attached to the hermetic sealing case in proximity to the planar glass plate, and a light converging lens is attached onto the planar glass plate. A holding member for the light converging lens is closely attached to the hermetic sealing case and holds the lowermost peripheral portion of the light converging lens, and a member presses the holder member of the light converging lens against the hermetic sealing case to secure the close attachment of the holder member for the light converging lens onto the planar glass plate.

4 Claims, 2 Drawing Figures

LIGHT-SENSIBLE SEMICONDUCTOR DEVICE

This invention relates generally to light-sensible semiconductor devices and more particularly to an improved structure of a hermetically housed light-sensible semiconductor device employing an extremely tiny lens which is capable of receiving light at greater angles of incidence.

In conventional devices of this kind in which a lens is bonded to a planar glass plate by use of a bonding material, the degradation in bonding strength and the discoloration of the bonding portion may occur, especially at high temperatures. In the presence of additional effects such as ultraviolet irradiation or a high ambient humidity, the operational reliability of such devices would be markedly degraded. In addition, in the production of such devices it is difficult to accurately align the optical axis of a lens and a semiconductor chip as a result of the fact that a light-sensible semiconductor chip is extremely small in size, commonly less than 1 mm in diameter.

It is consequently an object of this invention to provide an improved, hermetically housed light-sensible semiconductor device structure which overcomes or at least greatly reduces the above-mentioned limitations of the prior art.

The light-sensible semiconductor device according to this invention comprises a hermetic sealing case provided with a thin planar glass plate as the top surface member. A light-sensible semiconductor chip is fixed in position within the hermetic sealing case in proximity to the planar glass plate, and a light converging lens is attached onto the planar glass plate. A holder member for the light converging lens is closely attached to the hermetic sealing case and holds the lowermost peripheral portion of the light converging lens, and a member for presses the holder member of the light converging lens against the hermetic sealing case to provide a close attachment of the holder member to the planar glass plate.

Figure 1:
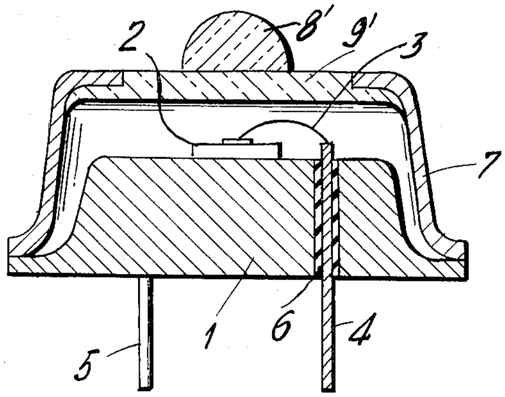
(PRIOR ART) FIG. 1
Figure 2:
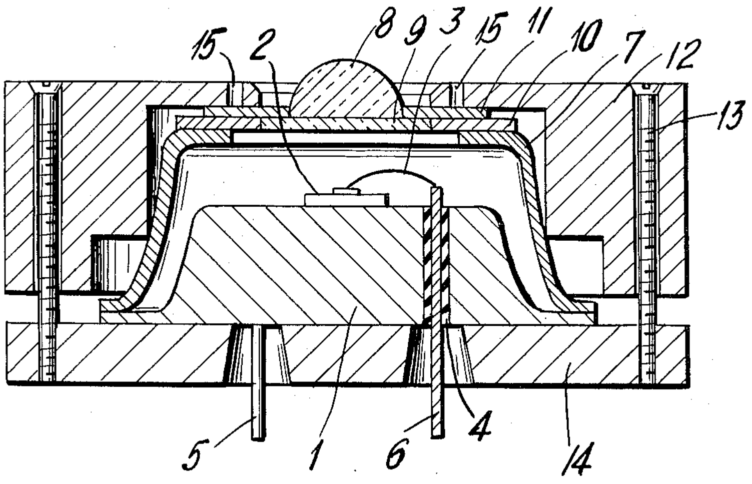

To better appreciate the substantial advantages of the improved structure according to the present invention, the present invention will be described in greater detail by reference to the accompanying drawings, wherein:

FIG. 1 is a cross-sectional view of a conventional light-sensible semiconductor device; and FIG. 2 is a cross-sectional view of a light-sensible semiconductor device embodying the present invention.

Referring to the prior art device illustrated in FIG. 1, a semiconductor chip 2 is mounted centrally on the top surface of a stem body 1 made of Covar. A leadout wire 4 is inserted in a hole penetrating through the top and bottom surfaces of the stem body 1 together with an intermediary insulating member 6 such as Covar-glass tubing. An internal lead wire 3 connects one end of the leadout wire 4 with the semiconductor chip 2, and another leadout wire 5 is directly bonded to the bottom of the stem body 1.

A light converging lens 8' is attached onto a planar glass plate 9' by a suitable bonding material. The glass plate 9' is fused to a metallic cap 7 which is, in turn, electrically welded to the stem body 1 at the peripheral rim portion thereof to effect hermetic sealing.

In a conventional device structure such as that illustrated in FIG. 1, an organic bonding material, for instance, is often employed to bond the lens 8' to the glass plate 9'. When the bonding portion reaches high temperatures exceeding 150°C, a degradation in bonding strength and a discoloration of the bond occur. Whenever these deleterious results are combined with the deleterious effects of ultraviolet rays or a high ambient humidity, a there is marked degree of degradation in device reliability.

Referring to the embodiment of this invention shown in FIG. 2, the same or equivalent structural members used in the structure of FIG. 1 are designated by the same reference numerals, 1 through 7. The principal differences between the prior art structure of FIG. 1 and that of FIG. 2 will now be described.

In the structure illustrated in FIG. 2, a planar glass plate 9 is made thinner than the one used in the structure of FIG. 1, and may be, for example, 0.5 mm in thickness. Glass plate 9 is made of Covar glass with both surfaces optically polished and is fused to a metallic ring 10 made of Covar. The ring 10 is, in turn, welded to a cap 7 so that a spacing of approximately 1.3 mm is produced between the top surface of the semiconductor chip 2 and the bottom surface of the glass plate 9. A light converging lens 8 is of a hemispherical shape, and typically 1 mm in diameter, is made of a glass with a high index of refraction. For example, the lens 8 may be made of a glass with an index of refraction of about 1.72 mm and have a composition of 41.3% $B_2O_3$, 32.4% $La_2O_3$, 12.1% CaO, 8.1% $ZrO_2$, and 6.1% PbO. Both convex and plane surfaces of the lens are provided with a nonreflecting coating. The light-receiving effective area of the semiconductor chip 2 is 0.25 $mm^2$, and the angle ranges for permitting reception of 100 and 70 percent incident light of the light converging system are, respectively, ±8° and ±11°.

The lens 8 is securely held at its lowermost peripheral portion by a lens holder 11 made of a brass ring ranging between 0.1 – 0.2 mm in thickness. By squeezing together a pressurizing case 12 and an auxiliary case 14 with screws 13, a mechanical force is exerted on the lens holder 11 to press the holder 11 against the ring 10 or the cap 7, and the lens 8 can be securely attached with pressure onto the surface of the glass plate 9 without using a bonding material.

With a structure incorporating this optical system, the lens 8 should in no way be affected by temperature, ambient humidity, or the effects of ultraviolet rays or any mechanical forces applied to the overall assembly.

The reason why the Covar ring 10 is used in the present invention as illustrated in FIG. 2 is that it is difficult to obtain a thin and optically flat glass plate with the conventional planar glass plate 9' structure as shown in FIG. 1. Particularly, with planar glass of a small area the flatness of the bottom surface of the planar glass plate is further degraded, and it is extremely difficult to polish both surfaces of the planar glass plate.

In the present invention, the circumference of the planar glass plate 9 is fused to the Covar ring 10, and thereafter the Covar ring 10 is welded to the metallic cap 7. By adopting such structure, it is possible to reduce both the area and thickness of the glass plate 9.

It is not advantageous, from the viewpoints of manufacturing cost and finishing, to prepare the Covar ring 10 with the glass plate 9 in a piecemeal manner. This subassembly should preferably be produced through the successive steps of preparing a hollow cylindrical body made of Covar having the same cross section as the Covar ring 10, inserting a solid Covar glass rod into the hollow or alternatively, filling the hollow with a powder of Covar glass, heating to fuse the Covar glass to the inner surface of the Covar body, cutting the assembled body with a sharp-edged cutter into a plurality of disks, and finally, polishing both surfaces of the individual disks. The lens holder 11 is used not only to attach the lens 8 to the glass plate 9 securely in position without using a bonding material as mentioned previously, but also to freely adjust the lens position within a certain extent for aligning the optical axis of the lens 8 with the chip 2. Stated more specifically, after the lens 8 has been mounted on the glass plate 9, the lens is held by the lens holder 11. Then, with the screws 13 held loosened, the optical axis of the lens 8 is brought into alignment with the center of the light-sensing portion of the light-sensible semiconductor chip by suitably displacing the lens holder 11. This is followed by a tightening of the screws 13 to produce a mechanical force between the pressurizing case 12 and the auxiliary case 14 for the secure attachment of the lens 8 onto the glass plate 9. It is desirable that two or more through holes 15 be provided in the top plate of the pressurizing case 12 at suitable locations for the purpose of facilitating the displacement of the lens holder 11 from outside.

It will be obvious from the foregoing description that the light-sensible semiconductor device according to this invention has outstanding advantages over conventional devices of this type including improved performance and ease of alignment of the optical axis.

Although the invention has been herein specifically described with respect to a single embodiment, it will be understood that modifications may be made therein without necessarily departing from the spirit and scope of the invention.

I claim:

1. A hermetically housed light-sensible semiconductor device comprising a hermetic sealing case, a thin planar glass plate constituting a part of the top surface of said case, a light-sensible semiconductor chip disposed within said hermetic sealing case in proximity to said thin planar glass plate, a light converging lens securely attached to said thin planar glass plate, a holding member closely attached to said thin planar glass plate and holding the lowermost peripheral portion of said light converging lens, and means for pressing said holding member on said hermetic sealing case to bring about a close contact between said light converging lens and said thin planar glass plate.

2. The light-sensible semiconductor device as claimed in claim 1, wherein said holding member is composed of a thin metallic ring, and the periphery of said thin planar glass plate is fused to the inner wall of said thin metallic ring, said thin metallic ring being welded to said hermetic sealing case.

3. The light-sensible semiconductor device as claimed in claim 1, wherein said pressing means comprises a first member fixed to the bottom surface of said case, a second member adapted to make contact with said holding member, and a screw mechanically connecting said first member with said second member.

4. The light-sensible semiconductor device as claimed in claim 3, wherein said second member has at least one through hole adapted to enable the displacement of said holding member from the outside when said screw is loosened.

* * * * *